(12) United States Patent
Li

(10) Patent No.: US 12,550,315 B2
(45) Date of Patent: Feb. 10, 2026

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Min Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 680 days.

(21) Appl. No.: 17/933,138

(22) Filed: Sep. 19, 2022

(65) Prior Publication Data

US 2023/0413532 A1    Dec. 21, 2023

Related U.S. Application Data

(63) Continuation of application No. PCT/CN2022/099978, filed on Jun. 20, 2022.

(30) Foreign Application Priority Data

May 24, 2022    (CN) .......................... 202210575555.3

(51) Int. Cl.
| H01L 29/76 | (2006.01) |
| H01L 29/94 | (2006.01) |
| H10B 12/00 | (2023.01) |

(52) U.S. Cl.
CPC ....... H10B 12/395 (2023.02); H10B 12/0383 (2023.02)

(58) Field of Classification Search
CPC .. H10B 12/395; H10B 12/0383; H10B 12/34; H10B 12/053

(Continued)

(56) References Cited

U.S. PATENT DOCUMENTS

| 7,612,406 B2 | 11/2009 | Kluge |
| 8,304,824 B2 | 11/2012 | Kim et al. |

(Continued)

FOREIGN PATENT DOCUMENTS

| CN | 101140950 A | 3/2008 |
| CN | 102034824 A | 4/2011 |

(Continued)

OTHER PUBLICATIONS

International Search Report cited in PCT/CN2022/098124 mailed Dec. 16, 2022, 8 pages.

(Continued)

*Primary Examiner* — Theresa T Doan
(74) *Attorney, Agent, or Firm* — Kilpatrick Townsend & Stockton LLP

(57) ABSTRACT

Embodiments of the present disclosure relate to the field of semiconductors, and provide a semiconductor structure and a manufacturing method thereof. The semiconductor structure includes: a substrate, including active regions arranged in an array and an isolation structure separating the active regions, where the substrate has a first surface and a second surface opposite to each other; a buried word line structure, located at a side, close to the second surface, in the substrate and embedded in the active regions; a bit line structure, located on the first side of the substrate and electrically connected to the active regions; and capacitor structures, located on the second surface of the substrate and correspondingly connected to the active regions in a one-to-one manner.

18 Claims, 13 Drawing Sheets

(58) Field of Classification Search
USPC ......................................................... 257/302
See application file for complete search history.

(56) References Cited

U.S. PATENT DOCUMENTS

| | | | |
|---|---|---|---|
| 9,245,893 | B1 | 1/2016 | Sukekawa |
| 10,910,380 | B2 | 2/2021 | Takesako et al. |
| 11,164,770 | B1 | 11/2021 | Or-Bach et al. |
| 2023/0005924 | A1* | 1/2023 | Park .................. H10B 12/0335 |

FOREIGN PATENT DOCUMENTS

| | | |
|---|---|---|
| CN | 109256382 A | 1/2019 |
| CN | 112864158 A | 5/2021 |
| CN | 113192956 A | 7/2021 |
| CN | 113517232 A | 10/2021 |

OTHER PUBLICATIONS

International Search Report cited in PCT/CN2022/099978 mailed Dec. 19, 2022, 8 pages.

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/099978, filed on Jun. 20, 2022, which claims the priority to Chinese Patent Application No. 202210575555.3, titled "SEMICONDUCTOR STRUCTURE AND MANUFACTURING METHOD THEREOF" and filed on May 24, 2022. The entire contents of International Application No. PCT/CN2022/099978 and Chinese Patent Application No. 202210575555.3 are incorporated herein by reference.

TECHNICAL FIELD

Embodiments of the present disclosure relate to the technical field of semiconductors, and in particular to a semiconductor structure and a manufacturing method thereof.

BACKGROUND

A memory is a memory component for storing programs and various data information. Random access memory (RAM) used in a computer system is generally divided into static random access memory (SRAM) and dynamic random access memory (DRAM). As a commonly used semiconductor memory in computers, a DRAM is composed of many repeated memory cells.

A memory cell typically includes a capacitor and a transistor. In the transistor, a drain is connected to a bit line, and a source is connected to the capacitor. The capacitor includes a capacitive contact structure and a capacitor unit. The word line of the memory cell can control a channel region of the transistor to turn on or off, and then data information stored in the capacitor is read through the bit line, or data information is written into the capacitor through the bit line for storage.

SUMMARY

According to some embodiments of the present disclosure, an aspect of the embodiments of the present disclosure provides a semiconductor structure, including: a substrate, including active regions arranged in an array and an isolation structure separating the active regions, where the substrate has a first surface and a second surface opposite to each other; a buried word line structure, located at a side, close to the second surface, in the substrate and embedded in the active regions; a bit line structure, located on the first side of the substrate and electrically connected to the active regions; and capacitor structures, located on the second surface of the substrate and correspondingly connected to the active regions in a one-to-one manner.

According to some embodiments of the present disclosure, another aspect of the embodiments of the present disclosure further provides a method of manufacturing a semiconductor structure, including: providing a substrate, where the substrate includes active regions arranged in an array and an isolation structure separating the active regions, and the substrate has a first surface and a second surface opposite to each other; is forming a buried word line structure, where the buried word line structure is located at a side, close to the second surface, in the substrate and is embedded in the active regions; forming a bit line structure, where the bit line structure is located on the first surface of the substrate and electrically connected to the active regions; and forming capacitor structures, where the capacitor structures are located on the second surface of the substrate and correspondingly connected to the active regions in a one-to-one manner.

BRIEF DESCRIPTION OF THE DRAWINGS

One or more embodiments are described illustratively by use of corresponding drawings. The illustrative description does not constitute any limitation on the embodiments. Unless otherwise expressly specified, the drawings do not constitute a scale limitation. To describe the technical solutions in the embodiments of the present disclosure or in the prior art more clearly, the following outlines the drawings to be used in the embodiments of the present disclosure. Evidently, the drawings outlined below are merely some embodiments of the present disclosure. Those of ordinary skill in the art may derive other drawings from the outlined drawings without making any creative effort.

DETAILED DESCRIPTION

An embodiment of the present disclosure provides a semiconductor structure, a bit line structure is provided on a first surface of a substrate, a buried word line structure embedded in active regions is formed on a second surface of the substrate, and capacitor structures corresponding to the active regions in a one-to-one manner are formed on the second surface of the substrate, such that one transistor corresponds to one capacitor structure, a flow path of carriers in the transistor is made shorter, and the number of flow paths is increased.

The embodiments of the present disclosure are described in detail below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 1:
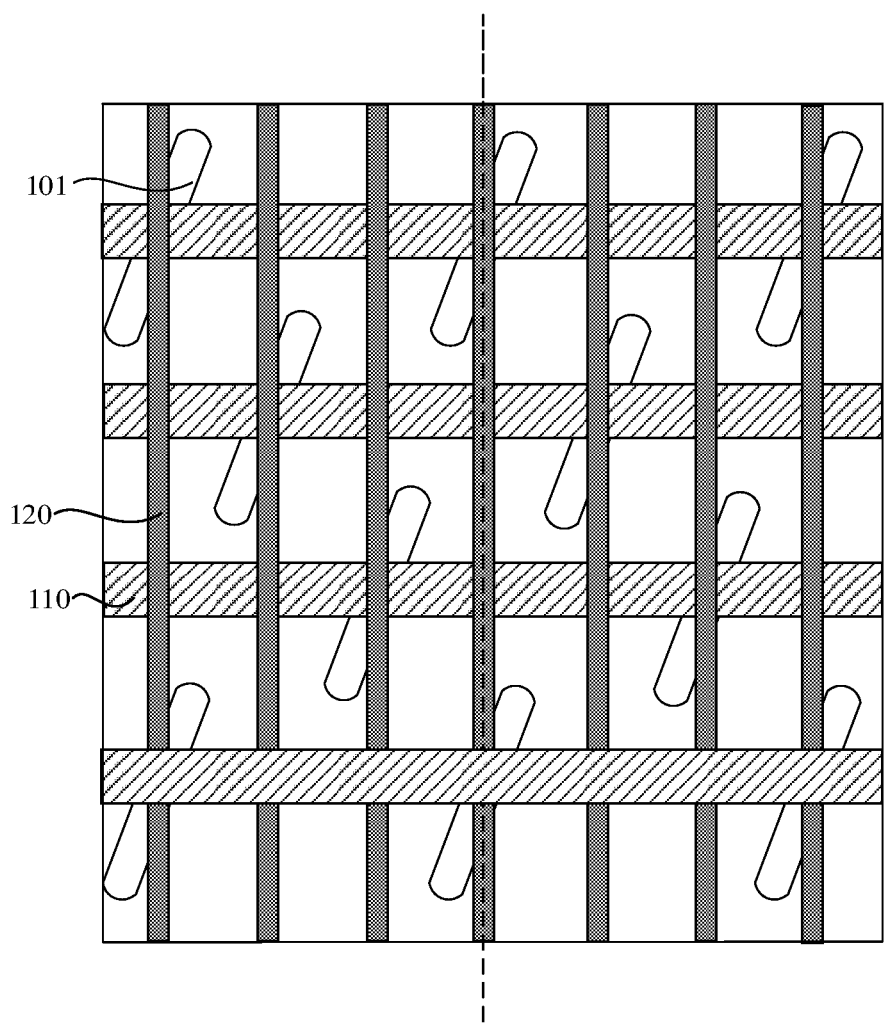
FIG. 1 is a top view of a semiconductor structure according to an embodiment of the present disclosure.
Figure 2:
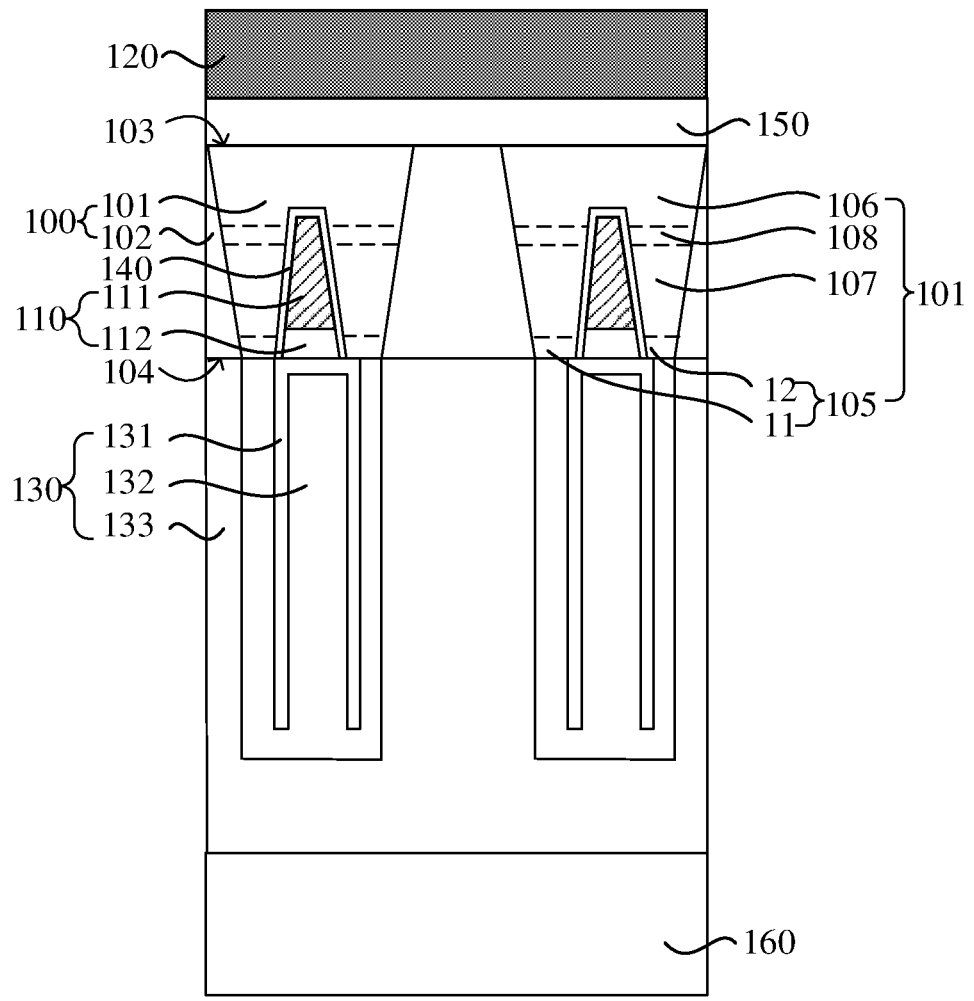
FIG. 2 is a top view of a semiconductor structure according to an embodiment of the present disclosure.

Referring to FIG. 1 and FIG. 2, FIG. 1 is a top view of a semiconductor structure according to an embodiment of the present disclosure, and FIG. 2 is a cross-sectional view taken along a dashed line in FIG. 1.

In some embodiments, the semiconductor structure includes: a substrate 100, including active regions 101 arranged in an array and an isolation structure 102 separating the active regions 101; a substrate 100, having a first surface 103 and a second surface 104 opposite to each other; a buried word line structure 110, located at a side, close to the second surface 104, in the substrate 100 and embedded in the active regions 101; a bit line structure 120, located on the first surface 103 of the substrate 100 and electrically connected to the active regions 101; and capacitor structures 130, located on the second surface 104 of the substrate 100 and correspondingly connected to the active regions 101 in a one-to-one manner.

By arranging the bit line structure 120 on the first surface of the substrate 100, the buried word line structure 110 and the capacitor structure 130 on the second surface of the substrate 100 can cause carriers in the active region 101 to flow towards the bit line structure 120 along a direction parallel to the capacitor structure 130, such that a flow path which the carriers need to pass through becomes shorter and the number of flow paths for the carriers is increased. That is, the length of the path that the carriers need to pass through becomes the length of a sidewall of the buried word line structure 110, and is the flow paths become two opposite sidewalls of the buried word line structure 110, thereby improving the transmission rate of the carriers and improving the electrical performance of the semiconductor structure.

In some embodiments, a material of the active region 101 may be silicon, germanium or silicon germanide, and the material of the active region 101 may also be doped. For example, if the material of the active region 101 is silicon, the active region 101 may be doped with a small amount of trivalent elements, such as boron, indium, gallium or aluminum, to form a P-type base; similarly, the active region 101 may be doped with a small amount of pentavalent elements, such as phosphorus, antimony, or arsenic to form an N-type base. Doping elements of the active region 101 can be selected based on actual requirements and product performance. The present disclosure does not limit the material of the active region 101 and the dopant elements.

In some embodiments, a material of the isolation structure 102 may be an insulation material such as silicon oxide or silicon nitride, thereby directly isolating adjacent active regions 101 to avoid interference between adjacent active regions 101.

In some embodiments, the buried word line structure 110 includes: a word line conductive layer 111 and a word line protective layer 112, where the word line conductive layer 111 is configured to transmit a signal, and the word line protective layer 112 is configured to protect the word line conductive layer 111, to reduce a stress effect on the word line conductive layer 111 when the semiconductor structure is under the effect of stress.

In some embodiments, a material of the word line conductive layer 111 may be a metal material such as tungsten, and a material of the word line protective layer 112 may be an insulation material such as silicon nitride.

In some embodiments, a gate dielectric layer 140 is further provided between the buried word line structure 110 and the active region 101. A thickness of the gate dielectric layer 140 may be adjusted according to actual requirements. The gate dielectric layer 140 is configured to isolate the buried word line structure 110 from the active region 101, to avoid direct contact between the buried word line structure 110 and the active region 101.

In some embodiments, the bit line structure 120 is a single-layer structure, and a material of the bit line structure 120 may be a metal material such as tungsten; in other embodiments, the bit line structure 120 may be a multi-layer structure, which may include a polysilicon layer and a metal layer. The polysilicon layer avoids an error caused by direct signal transmission from the active region to the metal material. This embodiment of the present disclosure does not limit the number of layers of the bit line structure 120, and the number of layers can be adjusted according to actual requirements.

In some embodiments, a barrier layer 150 is further provided between the bit line structure 120 and the substrate 100. The barrier layer 150 can prevent the metal material of the bit line structure 120 from polluting the substrate 100 when ion diffusion occurs, thereby avoiding anomaly of the substrate 100. The barrier layer 150 can improve the reliability of the semiconductor structure.

In some embodiments, a material of the barrier layer 150 may be titanium nitride.

In some embodiments, the capacitor structure 130 includes: a bottom electrode plate 131, a capacitive dielectric layer 132, and a top electrode plate 133. The capacitive dielectric layer 132 is located between the bottom electrode plate 131 and the top electrode plate 133. A material of the bottom electrode plate 131 may include any one or any combination of titanium nitride, tantalum nitride, copper or tungsten, or other metal materials. A material of the capacitive dielectric layer 132 may include any one or any combination of ZrO, AlO, ZrNbO, ZrHfO, ZrAlO. A material of the top electrode plate 133 includes a compound formed by one or both of metal nitride and metal silicide, such as titanium nitride, titanium silicide, nickel silicide, titanium silicon nitride or other conductive materials, or the material of the top electrode plate 133 may be a conductive semiconductor material, such as polysilicon, germanium silicon, etc.

It may be understood that, an alignment area between the bottom electrode plate 131 and the top electrode plate 133 of the capacitor structure 130, a distance between the bottom electrode plate 131 and the top electrode plate 133, and a material of the capacitive dielectric layer 132 may affect the capacitance of the capacitor structure 130. Therefore, the alignment area between the bottom electrode plate 131 and the top electrode plate 133 of the capacitor structure 130, the distance between the bottom electrode plate 131 and the top electrode plate 133, and the material of the capacitive is dielectric layer 132 may be set according to actual requirements.

In some embodiments, the semiconductor structure further includes: a carrier layer 160. The carrier layer 160 may be configured to prevent a fixture device from damaging other film layers of the semiconductor structure during fixing of the semiconductor structure. In other embodiments, the carrier layer can also be used as an interlayer dielectric layer, thereby providing a process basis for subsequent stacking of different substrates and reducing the size of the semiconductor structure.

In some embodiments, the active region 101 may include a first source-drain doped region 105 and a second source-drain doped region 106. The first source-drain doped region 105 extends from the second surface 104 to the interior of the substrate 100, and the second source-drain doped region 106 extends from the first surface 103 to the interior of the substrate 100. The buried word line structure 110 is located in the substrate 100 and extends from the second surface 104 to the first surface 103. The first source-drain doped region 105 is located in the same active region 101 and at two opposite sides of the buried word line structure 110, and the buried word line structure 110 extends along a first direction X. The bit line structure 120 is located on the first surface 103 of the substrate 100, is electrically connected to the second source-drain doped region 106, and extends along a second direction Y. The capacitor structure 130 is located on the second surface 104 of the substrate 100 and is electrically connected to the first source-drain doped region 105.

The first source-drain doped region 105 and the second source-drain doped region 106 are used as a source and a drain of a transistor. By arranging the source and drain in a direction pointing from the first surface 103 to the second surface 104, the flow path of the carriers becomes parallel to the direction pointing from the first surface 103 to the second surface 104, thereby reducing the length of the flow path of the carriers and improving a response rate of the semiconductor structure. Moreover, the number of flow paths of the carriers is increased, and two opposite sides of the buried word line structure 110 are both flow paths of the carriers, thereby improving the transmission rate of the carriers and the electrical performance of the semiconductor structure.

In some embodiments, the active region 101 further includes a channel region 107. The channel region 107 is located between the first source-drain doped region 105 and the second source-drain doped region 106, and is connected to the first source-drain doped region 105. The first source-drain doped region 105 is located in the same active region 101 and at two opposite sides of the buried word line structure 110, and at least a part of the word line conductive layer 111 is located in the channel region 107.

It may be understood that, a length of the channel region 107 in a direction pointing from the first surface 103 to the second surface 104 is a length of the flow path of the carriers. The channel region 107 is arranged at two opposite sides of the buried word line structure 110, such that a flow direction of the carriers becomes parallel to the direction pointing from first surface 103 to the second surface 104, thereby reducing the length of the flow path of the carriers. Moreover, the flow paths of the carriers become two opposite sides of the buried word line structure 110, thereby increasing the number of carrier flow paths and improving the electrical performance of the semiconductor structure.

In some embodiments, dopant ions of the first source-drain doped region 105 and the second source-drain doped region 106 are of a same ion type. By doping the first source-drain doped region 105 and the second source-drain doped region 106 with a trivalent element, such as boron, indium, gallium, or aluminum, and the channel region 107 with a pentavalent element, such as phosphorus, antimony, or arsenic, a PNP-type transistor can be formed. By doping the first source-drain doped region 105 and the second source-drain doped region 106 with a pentavalent element, such as phosphorus, antimony, or arsenic, and the channel region 107 with a trivalent element, such as boron, indium, gallium, or aluminum, an NPN-type transistor can be formed.

For example, the first source-drain doped region 105 and the second source-drain doped region 106 are doped with a pentavalent element, and the channel region 107 is doped with a trivalent element. By setting a doping concentration of the first source-drain doped region 105 to 1e14-8e15 and a doping concentration of the second source-drain doped region 106 to 1e14-8e15, the performance of the transistor can be improved. Moreover, by setting the doping concentration of the first source-drain doped region 105 to 1e14-8e15 and the doping concentration of the second source-drain doped region 106 to 1e14-8e15, contact resistance between the buried word line structure 110 and the is active region 101 and contact resistance between the bit line structure 120 and the active region 101 can be reduced.

In some embodiments, a doped region 108 is further provided between the channel region 107 and the second source-drain doped region 106. Dopant ions of the doped region 108 may be the same as the dopant ions of the second source-drain doped region 106, and a concentration of the dopant ions of the doped region 108 is lower than that of the dopant ions of the second source-drain doped region 106. In other embodiments, there may be no doped region between the channel region and the second source-drain doped region. The doped region 108 can achieve a buffer function during carrier transmission, and can adjust a threshold voltage of the gate.

In some embodiments, the first source-drain doped region 105 includes: a first doped sub-region 11 and a second doped sub-region 12. The first doped sub-region 11 and the second doped sub-region 12 are arranged at an interval in the same active region 101 and at two opposite sides of the buried word line structure 110. It may be understood that, the widths of the first doped sub-region 11 and the second doped sub-region 12 may be controlled by setting the position of the buried word line structure 110. When the buried word line structure 110 is located near a central axis of the active region 101, the width of the first doped sub-region 11 is equal to the width of the second doped sub-region 12; when the buried word line structure 110 is located at a position deviated from the central axis of the active region 101 towards the second doped sub-region 12, the width of the first doped sub-region 11 is greater than the width of the second doped sub-region 12.

When the width of the first doped sub-region 11 is equal to the width of the second doped sub-region 12, anomaly of the first source-drain doped region 105 due to a width difference between the first doped sub-region 11 and the second doped sub-region 12 can be avoided, thereby improving the reliability of the semiconductor structure. When the width of the first doped sub-region 11 is greater than the width of the second doped sub-region 12, the transmission capability of the first doped sub-region 11 can be improved, thereby improving the performance of the transistor and the electrical performance of the semiconductor structure.

In other embodiments, the width of the first doped sub-region 11 may alternatively be is less than the width of the second doped sub-region 12. The widths of the first doped sub-region 11 and the second doped sub-region 12 are not limited in this embodiment of the present disclosure, and can be adjusted according to actual requirements.

In some embodiments, a difference between the width of the first doped sub-region 11 and the width of the second doped sub-region 12 is less than ⅓ of the width of the second doped sub-region 12. The width difference between the first doped sub-region 11 and the second doped sub-region 12 is controlled to avoid anomaly of the first source-drain doped region 105 caused by the width difference, thereby improving the reliability of the semiconductor structure.

In some embodiments, a doping concentration of the second doped sub-region 12 is higher than a doping concentration of the first doped sub-region 11. By setting the doping concentration of the first doped sub-region 11 to be lower than that of the second doped sub-region 12, the transmission capability of the second doped sub-region 12 can be improved, thereby improving the performance of the transistor.

In other embodiments, the doping concentration of the first doped sub-region 11 may alternatively be higher than or equal to that of the second doped sub-region 12, which can be adjusted according to actual requirements.

In some embodiments, the width of the first doped sub-region 11 is greater than the width of the second doped sub-region 12, and the doping concentration of the first doped sub-region 11 is lower than the doping concentration of the second doped sub-region 12. It may be understood that, a larger width of the first doped sub-region 11 indicates a higher transmission capability of the first doped sub-region 11, and a higher doping concentration of the second doped sub-region 12 indicates a higher transmission capability of the second doped sub-region 12. By controlling the width of the first doped sub-region 11, the doping concentration of the first doped sub-region 11, the width of the second doped sub-region 12, and the doping concentration of the second doped sub-region 12, the transmission capabilities of the first doped sub-region 11 and the second doped sub-region 12 can be balanced, thereby avoiding anomaly of the semiconductor structure caused by a difference between the transmission capabilities of the first doped sub-region 11 and the second doped sub-region 12, thereby improving the reliability of is the semiconductor structure.

In some embodiments, the channel region 107 is unparallel with the first surface 103 or the second surface 104. That is, the channel region 107 extends along a direction pointing from the first surface 103 to the second surface 104, and the channel region 107 is a path that carriers needs to pass through to turn on the transistor. By controlling the channel region 107 to be unparallel with the first surface 103 or the second surface 104, the flow direction of the carriers becomes the direction pointing from the first surface 103 to the second surface 104, thereby reducing the length of the flow path of the carriers. Moreover, flow paths of the carriers become two opposite sides of the buried word line structure 110, thereby increasing the number of carrier flow paths, and improving the performance of the transistor.

In some embodiments, in a direction from the second surface 104 towards the first surface 103, a thickness of the word line conductive layer 111 is greater than or equal to a thickness of the channel region 107. The thickness of the word line conductive layer 111 is a between two surfaces of the word line conductive layer 111 that are spaced apart in the direction from the second surface 104 towards the first surface 103. The thickness of the channel region 107 is a distance between two surfaces of the channel region 107 that are spaced apart in the direction from the second surface 104 towards the first surface 103. The thickness of the word line conductive layer 111 is set to be greater than or equal to the thickness of the channel region 107 to reduce impact of the short-channel effect on the semiconductor structure.

In some embodiments, in the direction from the second surface 104 towards the first surface 103, a thickness of the buried word line structure 110 is ⅓ to ⅔ of a thickness of the substrate 100. It may be understood that, when the thickness of the buried word line structure 110 is less than ⅓ of the thickness of the substrate 100, the short-channel effect of the semiconductor structure is serious, thus affecting the threshold voltage of the device. When the thickness of the buried word line structure 110 is greater than ⅔ of the thickness of the substrate 100, the second source-drain doped region 106 is thin, resulting in a small number of carriers in the second source-drain doped region 106, thus affecting the transmission rate of the semiconductor structure.

This embodiment of the present disclosure provides a semiconductor structure. The bit line structure 120 is formed on the first surface 103 of the substrate 100, the buried word line structure 110 is formed on the second surface 104 of the substrate 100, and the capacitor structure 130 is formed on the surface of the active region 101, a flow path of carriers in the active region becomes parallel to a direction pointing from the first surface 103 to the second surface 104, thereby reducing the length of the flow path of the carriers, shortening the time required for circulation of the carriers, and improving the electrical performance of the semiconductor structure.

Another embodiment of the present disclosure further provides a method of manufacturing a semiconductor structure, which can be used to manufacture the foregoing semiconductor structure. The method of manufacturing a semiconductor structure provided by another embodiment of the present disclosure is described below with reference to the accompanying drawings. It should be noted that, for parts the same as or similar to those in the foregoing embodiment, reference may be made to the corresponding description in the foregoing embodiment, and details are not described again hereinafter.

Figure 3:
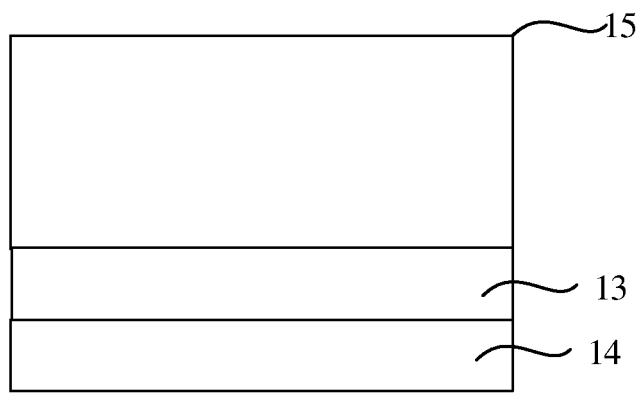
FIG. 3 to FIG. 12 are schematic structural diagrams corresponding to steps of a method of manufacturing a semiconductor structure according to an embodiment of the present disclosure.
Figure 4:
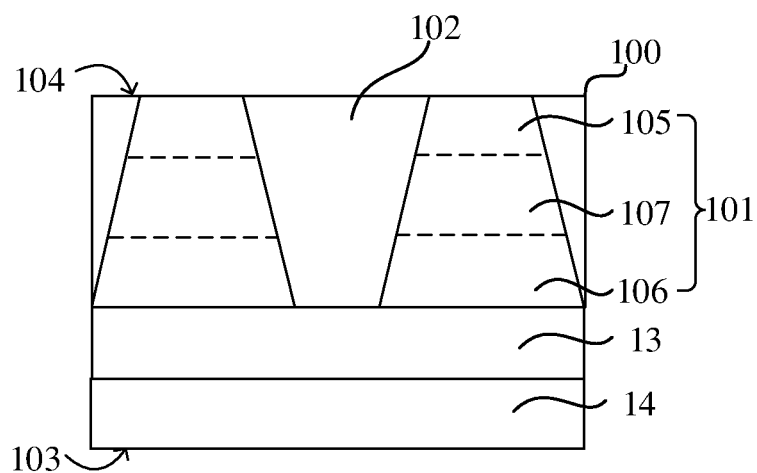

Referring to FIG. 3 and FIG. 4, FIG. 3 and FIG. 4 are cross-sectional views taken along a dashed line in FIG. 1.

Specifically, a substrate 100 is provided. The substrate 100 includes active regions 101 arranged in an array and an isolation structure 102 separating the active regions 101. The substrate 100 has a first surface 103 and a second surface 104 opposite to each other.

In some embodiments, the substrate 100 is silicon-on-insulator (SOI). The substrate 100 includes: active regions 101, an insulation layer 13 located on bottom surfaces of the active regions 101, and a base 14 located on a bottom surface of the insulation layer 13. The SOI substrate adds an insulation material between the base 14 and the active regions 101, thereby reducing parasitic capacitance between the base 14 and the active regions 101, such that a clock rate can be increased easily and current leakage can be reduced. The SOI substrate can further prevent electron loss and reduce some harmful electrical effects.

Referring to FIG. 3, an initial substrate 15 is provided. Referring to FIG. 4, the initial substrate 15 is patterned to form the active regions 101 arranged at intervals, and form the isolation structure 102 between the active regions 101.

It may be understood that, as the etching reagent is consumed, the profile structure of the formed active region 101 is a trapezoidal structure with a narrow top and a wide bottom.

In some embodiments, the active region 101 includes a first source-drain doped region 105 and a second source-drain doped region 106. The first source-drain doped region 105 extends from the second surface 104 to the interior of the substrate 100, and the second source-drain doped region 106 extends from the first surface 103 to the interior of the substrate 100.

In some embodiments, before the buried word line structure is formed, the method further includes: doping the active region 101 with ions, to form the first source-drain doped region 105, a channel region 107, and the second source-drain doped region 106 that are sequentially arranged from the second surface 104 towards the first surface 103 in the active region 101, and dopant ions of the first source-drain doped region 105 and the second source-drain doped region 106 are of a same ion type. The active region 101 is doped with ions to form the first source-drain doped region 105, the channel region 107, and the second source-drain doped region 106. That is, the source or drain, the gate, or the drain or source of the transistor, and different types of transistors can be formed by controlling the type of the dopant ions. The active region 101 is doped with ions to form the transistor, so as to ensure the performance of the semiconductor structure.

In some embodiments, the active region 101 is doped with ions along a direction pointing from the second surface 104 to the first surface 103.

It can be understood that the doping energy of the ion doping can be controlled to dope different regions of the active region 101, thereby forming different doped regions.

Referring to FIG. 5 to FIG. 8, a buried word line structure 110 is formed, where the buried word line structure 110 is located at a side, close to the second surface 104, in the substrate 100 and is embedded in the active region 101.

Figure 5:
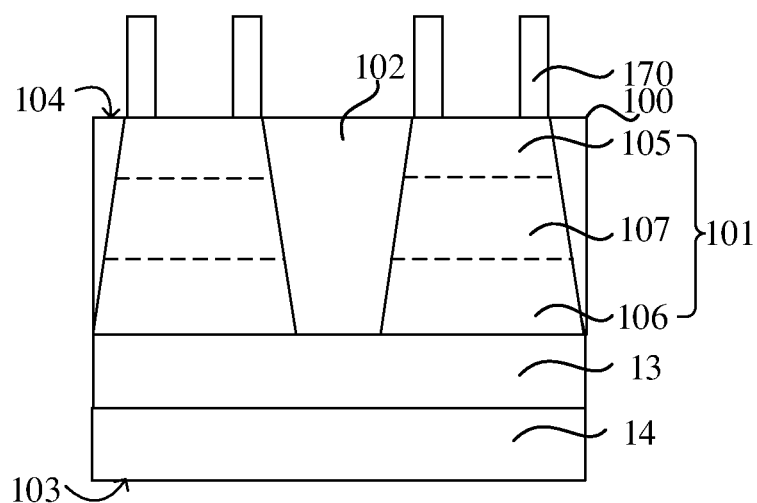

Specifically, referring to FIG. 5, a mask layer 170 is formed. The mask layer 170 is is located on the second surface 104 of the substrate 100 and may be made of a photoresist or an amorphous carbon material. For example, the mask layer 170 is made of an amorphous carbon material. By providing the mask layer 170, the pattern formed during subsequent forming of the buried word line structure 110 is more accurate. Moreover, the amorphous carbon material has a high etching speed, such that the mask layer 170 is formed quickly, thereby reducing the process duration.

Figure 6:
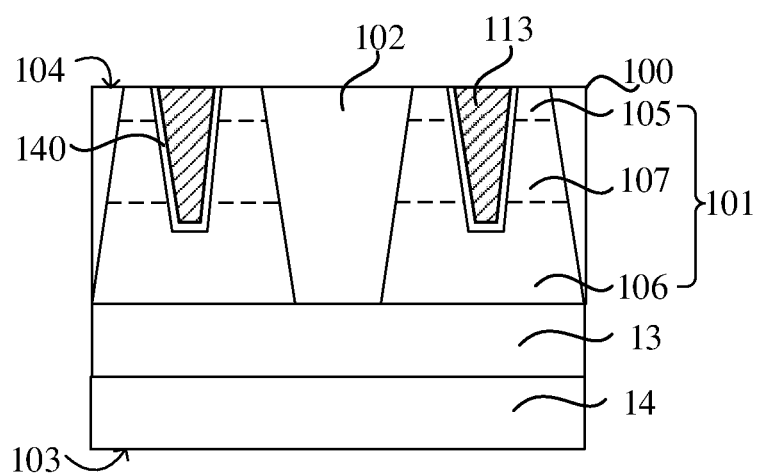

Referring to FIG. 6, the active region 101 is patterned and an initial word line conductive layer 113 is formed. A top surface of the initial word line conductive layer 113 is flush with a top surface of the active region 101. In some embodiments, before the initial word line conductive layer 113 is formed, the method further includes forming a gate dielectric layer 140. The gate dielectric layer 140 is configured to avoid direct contact between the initial word line conductive layer 113 and the active region 101.

In some embodiments, after the initial word line conductive layer 113 is formed, the method further includes: removing the mask layer 170 (referring to FIG. 5); in other embodiments, after the active region 101 is patterned and before the initial word line conductive layer 113 is formed, the method further includes: removing the mask layer 170 (referring to FIG. 5).

In some embodiments, a part of the initial word line conductive layer 113 is further located in the second source-drain doped region 106.

Figure 7:
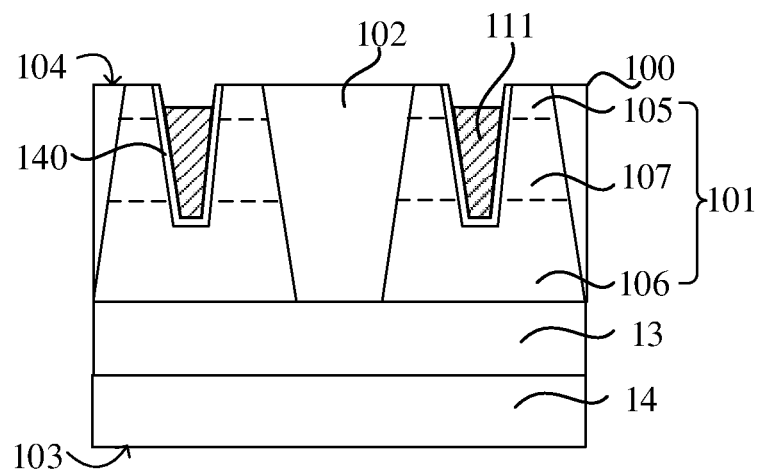

Referring to FIG. 7, the initial word line conductive layer 113 is etched back to form a word line conductive layer 111. A thickness of the word line conductive layer 111 in the direction from the first surface 103 towards the second surface 104 is controlled by etching back the initial word line conductive layer 113.

Figure 8:
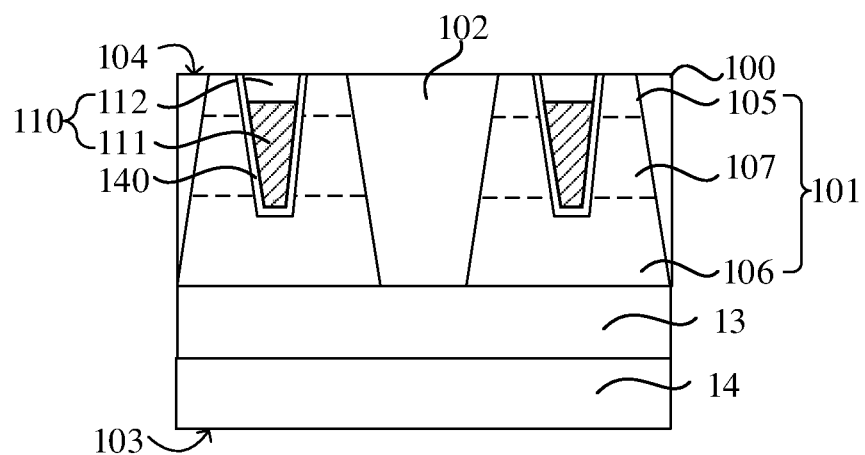

Referring to FIG. 8, a word line protective layer 112 is formed. The word line protective layer 112 may be configured to reduce a stress effect on the word line conductive layer 111 during subsequent processing of the semiconductor structure. The word line protective layer 112 and the word line conductive layer 111 form the buried word line structure 110. The buried word line structure 110 extends along the first direction. The buried word line structure 110 is located in the substrate 100 and extends from the second surface 104 to the first surface 103. The first source-drain doped region 105 is located in is the same active region 101 and at two opposite sides of the buried word line structure 110.

Figure 9:
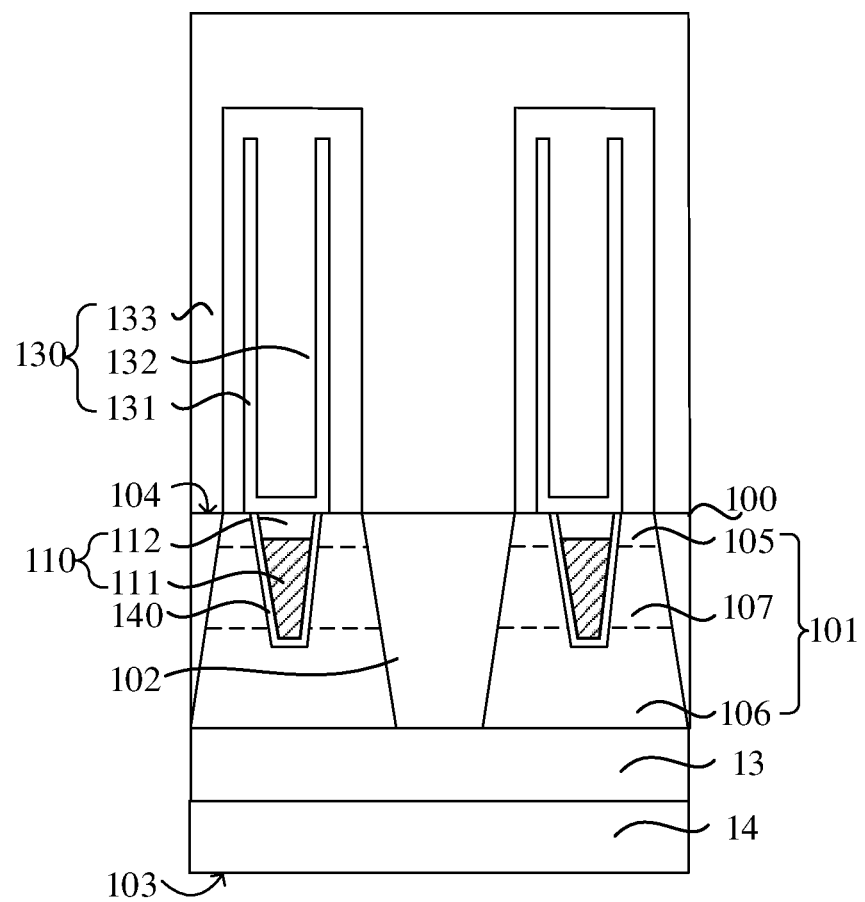

Referring to FIG. 9, capacitor structures 130 are formed. The capacitor structures 130 are located on the second surface 104 of the substrate 100 and are correspondingly connected to the active regions 101 in a one-to-one manner. The same capacitor structure 130 is electrically connected to the first source-drain doped region 105 at two sides of the buried word line structure 110.

In some embodiments, the capacitor structure 130 includes: a bottom electrode plate 131, a capacitive dielectric layer 132, and a top electrode plate 133. The capacitive dielectric layer 132 is located between the bottom electrode plate 131 and the top electrode plate 133.

Figure 10:
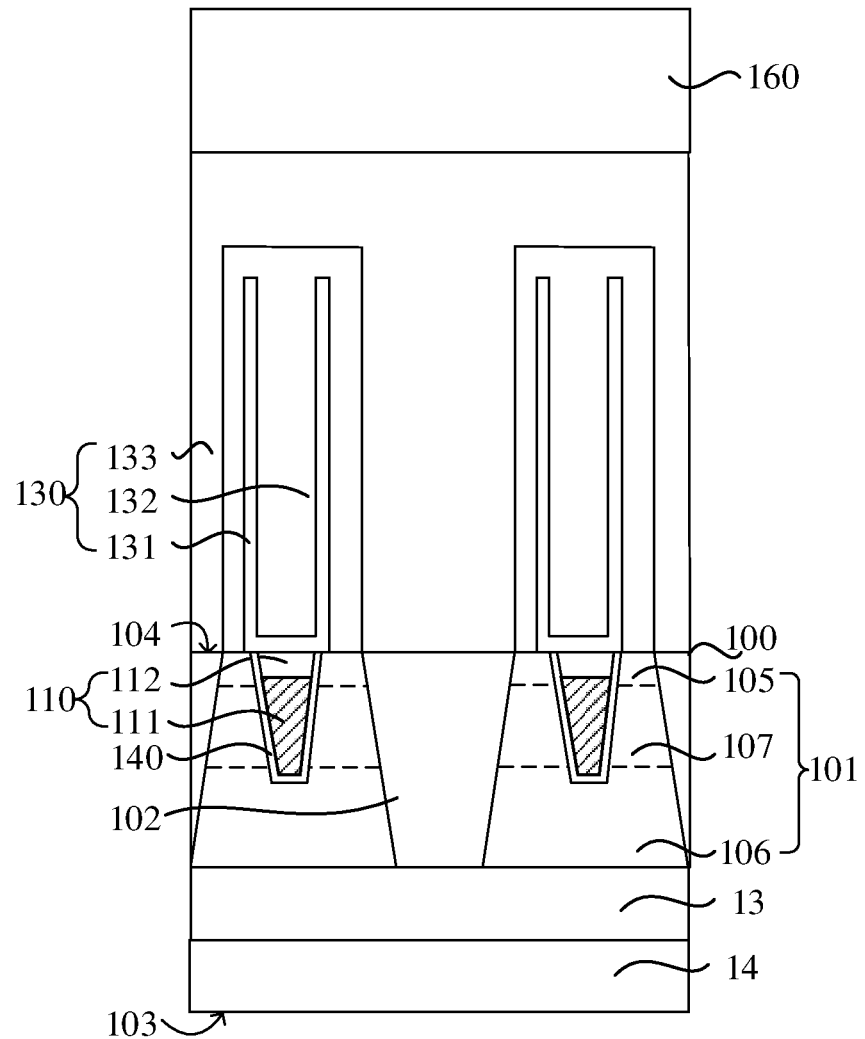

Referring to FIG. 10, a carrier layer 160 is formed. The carrier layer 160 is located on a surface of the capacitor structure 130 that is away from the active region 101. The carrier layer 160 can prevent a fixture device from damaging other film layers of the semiconductor structure during fixing of the semiconductor structure in a subsequent process. In other embodiments, the carrier layer can also be used as an interlayer dielectric layer, thereby providing a process basis for subsequent stacking of different substrates and reducing the size of the semiconductor structure.

Figure 11:
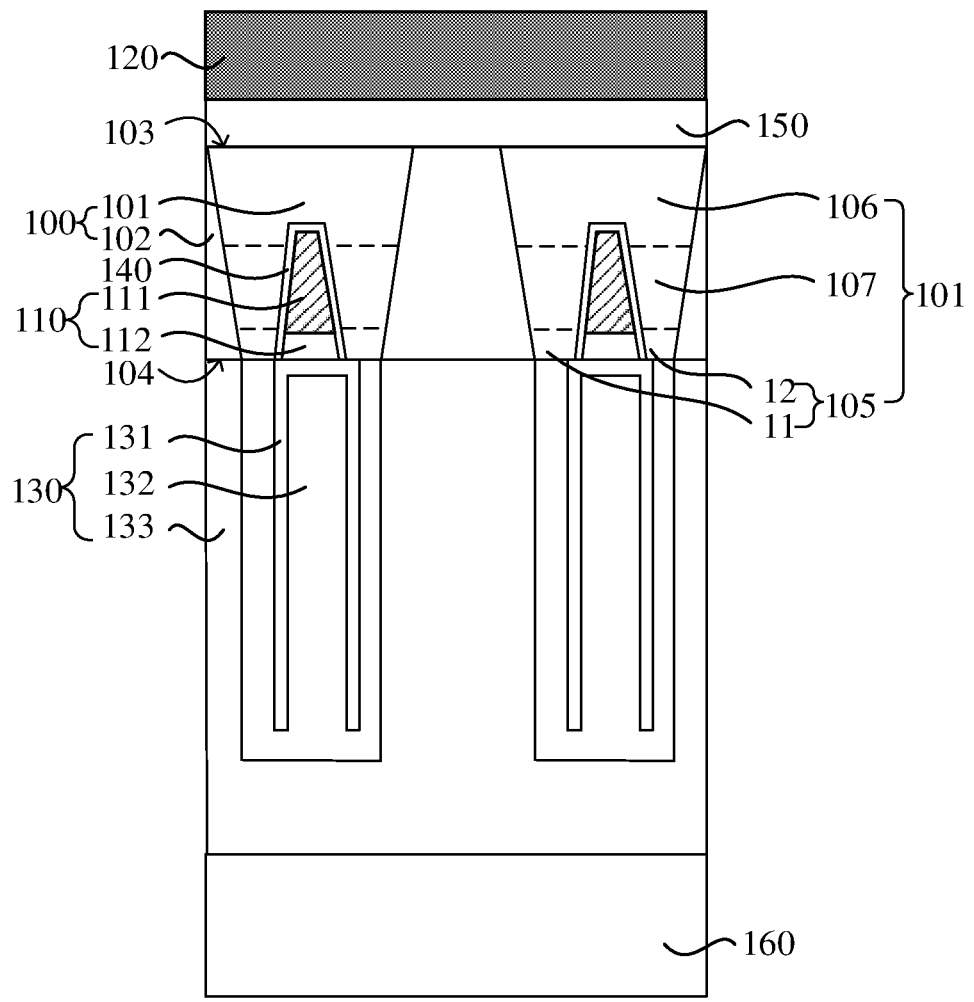

Referring to FIG. 11, a bit line structure 120 is formed. The bit line structure 120 is located on the first surface 103 of the substrate 100 and is electrically connected to the active regions 101. The bit line structure 120 extends along the second direction, and the bit line structure 120 is electrically connected to the second source-drain doped region 106. Data information stored in the capacitor structure 130 is read through the bit line structure 120, to realize functions of the semiconductor structure.

In some embodiments, before the bit line structure 120 is formed, the method further includes: removing the insulation layer 13 and the base 14, to expose the surfaces of the active regions 101, thereby providing a process basis for subsequently forming an electrical connection between the bit line structure 120 and the active regions 101.

In some embodiments, after the insulation layer 13 and the base 14 are removed, the method further includes: forming a barrier layer 150. The barrier layer 150 is located is on the first surface 103 of the substrate 100. The barrier layer 150 prevents metal ions forming the bit line structure 120 from polluting the active regions 101 when ion diffusion occurs subsequently, thereby improving the reliability of the semiconductor structure.

In some embodiments, before the insulation layer 13 and the base 14 are removed, the method further includes: flipping the semiconductor structure, such that the carrier layer 160 is located at the bottom surface of the semiconductor structure, to facilitate subsequent removal of the insulation layer 13 and the base 14 and forming of the bit line structure 120.

Figure 12:
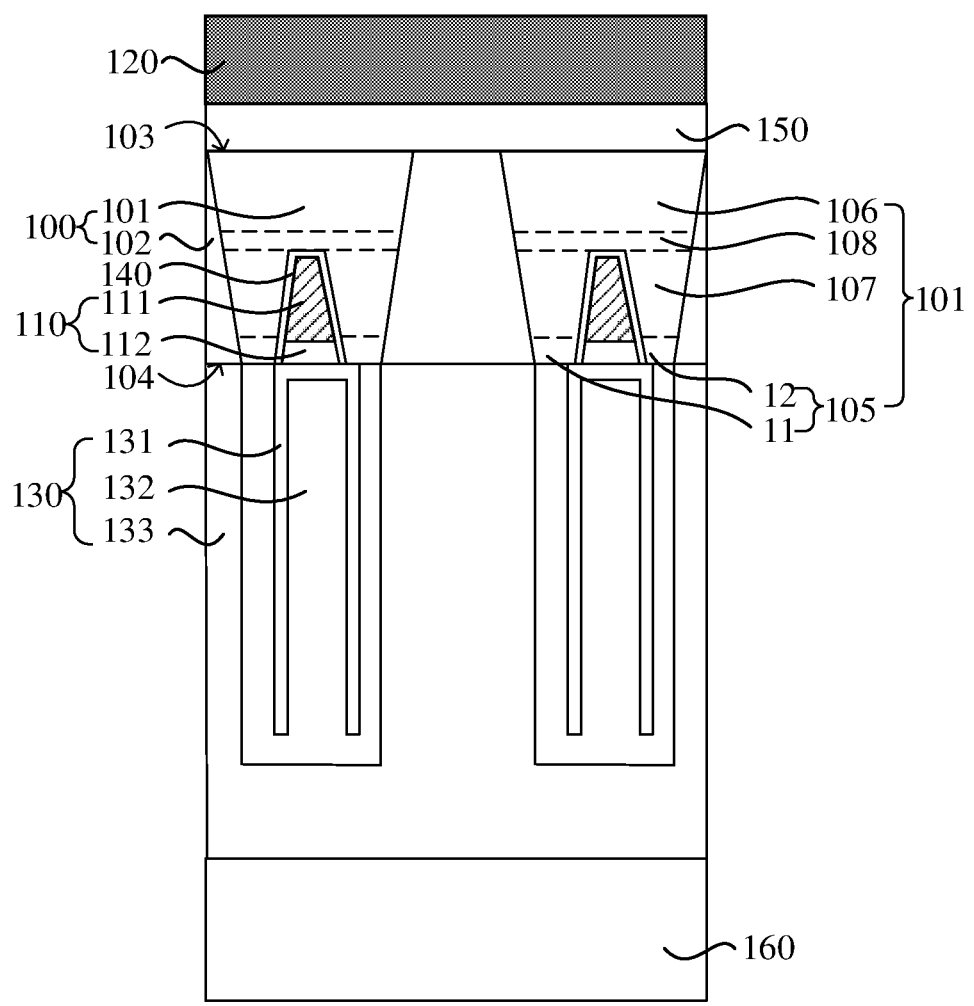

Referring to FIG. 12, in some embodiments, before the second source-drain doped region 106 is formed, the method further includes: forming a doped region 108, where the doped region 108 is located on a surface of the channel region 107, and dopant ions of the doped region 108 and the second source-drain doped region 106 are of a same ion type. It may be understood that, the current flows from the first source-drain doped region 105, enters the doped region 108 through the channel region 107, and finally arrives at the second source-drain doped region 106. Through the buffer effect of the doped region 108, the threshold voltage of the gate can be adjusted.

In some embodiments, a method for forming the doped region 108 includes: forming an initial doped region, where the initial doped region is located on a top surface of the channel region 107, and the substrate 100 exposes a surface of the initial doped region; heavily doping the initial doped region from the first surface 103 towards the second surface 104, to increase an ion concentration in a part of the initial doped region, where the remaining initial doped region is used as the doped region 108, and the part of the initial doped region with the increased ion concentration is used as the second source-drain doped region 106. In other words, after the channel region 107 is formed, an undoped part of the active region 101 is lightly doped to serve as the initial doped region; then, a part of the initial doped region is heavily doped to increase the ion concentration in a part of the initial doped region. The part of the initial doped region with the increased ion concentration is used as the second source-drain doped region 106, and the remaining initial doped region is used as the doped region 108.

This embodiment of the present disclosure provides a method of manufacturing a is semiconductor structure. The bit line structure 120 is formed on the first surface 103 of the substrate 100, the buried word line structure 110 located on the second surface 104 of the substrate 100 and in the active regions 101 is formed, and the capacitor structures 130 are further formed on the second surface 104, to form a semiconductor structure. Moreover, a current flow direction in the semiconductor structure is controlled to be parallel to the direction from the second surface 104 towards first surface 103, thereby shortening a flow path of carriers, improving a response speed of the semiconductor structure, and improving the electrical performance of the semiconductor structure.

An embodiment of the present disclosure further provides another method of manufacturing a semiconductor structure. This embodiment mainly differs from the foregoing embodiment in that: timing for forming the first source-drain doped region, the channel region, and the second source-drain doped region through ion doping is different. Another method of manufacturing a semiconductor structure provided by another embodiment of the present disclosure is described below with reference to the accompanying drawings. It should be noted that, for parts the same as or similar to those in the foregoing embodiment, reference may be made to the corresponding description in the foregoing embodiment, and details are not described again hereinafter.

Referring to FIG. 13 to FIG. 17, after the capacitor structures 130 are formed, the method further includes: doping the active region 101 with ions, to form the first source-drain doped region 105, the channel region 107, and the second source-drain doped region 106 that are sequentially arranged from the second surface 104 towards the first surface 103 in the active region 101, and dopant ions of the first source-drain doped region 105 and the second source-drain doped region 106 are of a same ion type. The active region 101 is doped with ions to form the first source-drain doped region 105, the channel region 107, and the second source-drain doped region 106. That is, the source or drain, the gate, or the drain or source of the transistor, and different types of transistors can be formed by controlling the type of the dopant ions. The active region 101 is doped with ions to form the transistor, so as to ensure the performance of the semiconductor structure.

Figure 13:
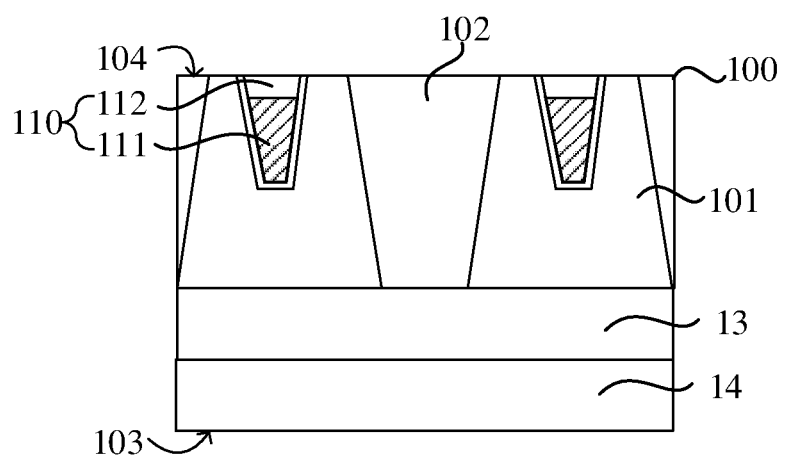
FIG. 13 to FIG. 18 are schematic structural diagrams corresponding to steps of a method of manufacturing a semiconductor structure according to another embodiment of the present disclosure.

Referring to FIG. 13, the semiconductor structure includes: a substrate 100. The is substrate 100 includes: active regions 101 arranged at intervals, an isolation structure located between the active regions 101, an insulation layer 13 located at a side of the active region 101 that is away from the second surface 104, a base 14 located at a side of the insulation layer 13 that is close to the first surface 103, and a buried word line structure 110, where the buried word line structure 110 includes a word line conductive layer 111 and a word line protective layer 112.

Figure 14:
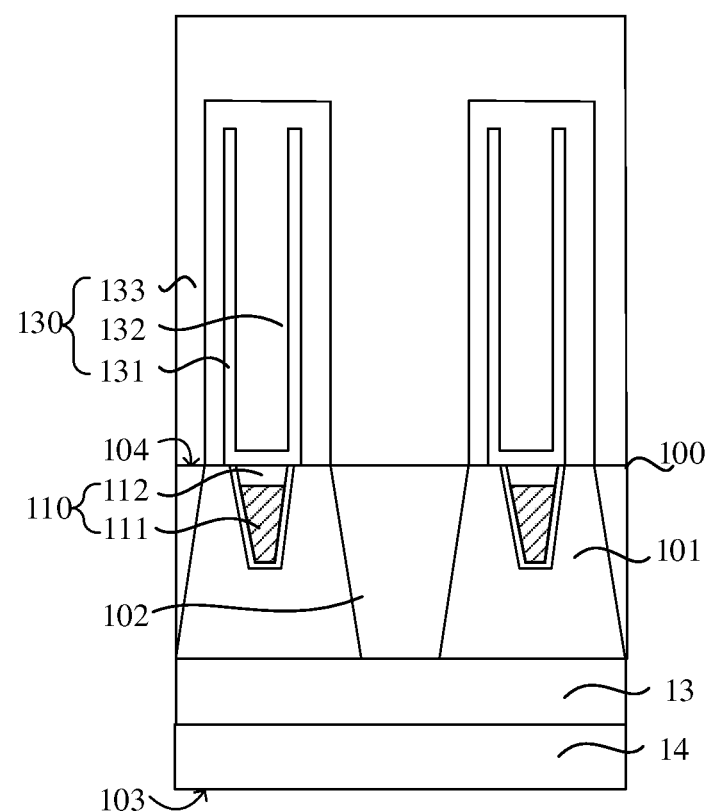

Referring to FIG. 14, capacitor structures 130 are formed. The capacitor structures 130 are located on the second surface 104 of the substrate 100. The capacitor structure 130 includes: a bottom electrode plate 131, a capacitive dielectric layer 132, and a top electrode plate 133. The capacitive dielectric layer 132 is located between the bottom electrode plate 131 and the top electrode plate 133.

Figure 15:
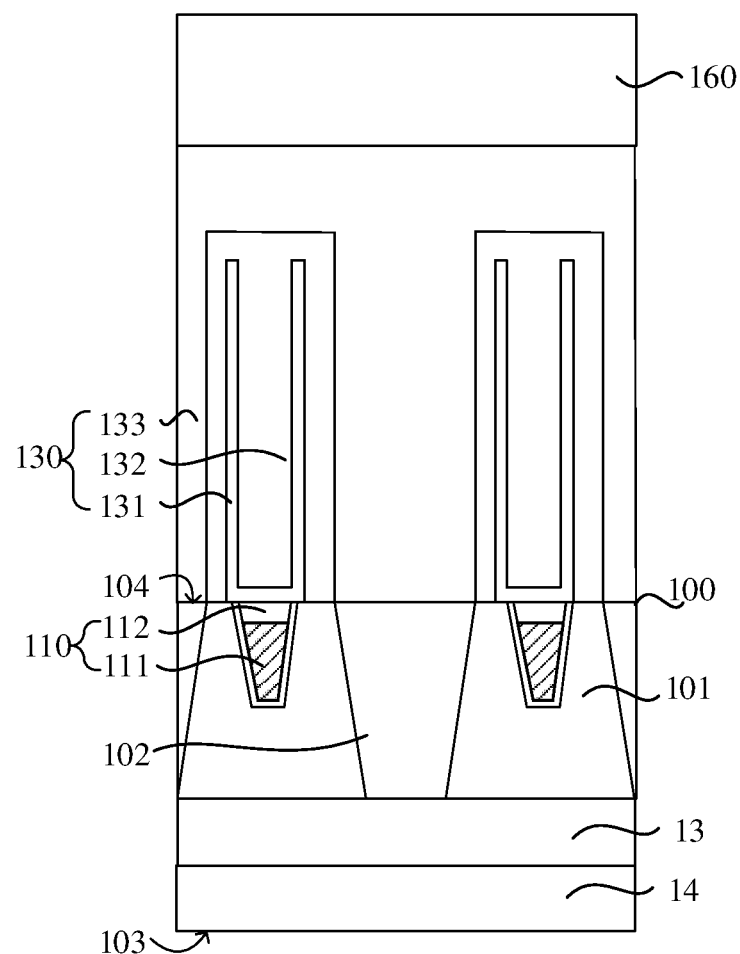

Referring to FIG. 15, a carrier layer 160 is formed. The carrier layer 160 is located on a surface of the capacitor structure 130 that is away from the substrate 100.

Figure 16:
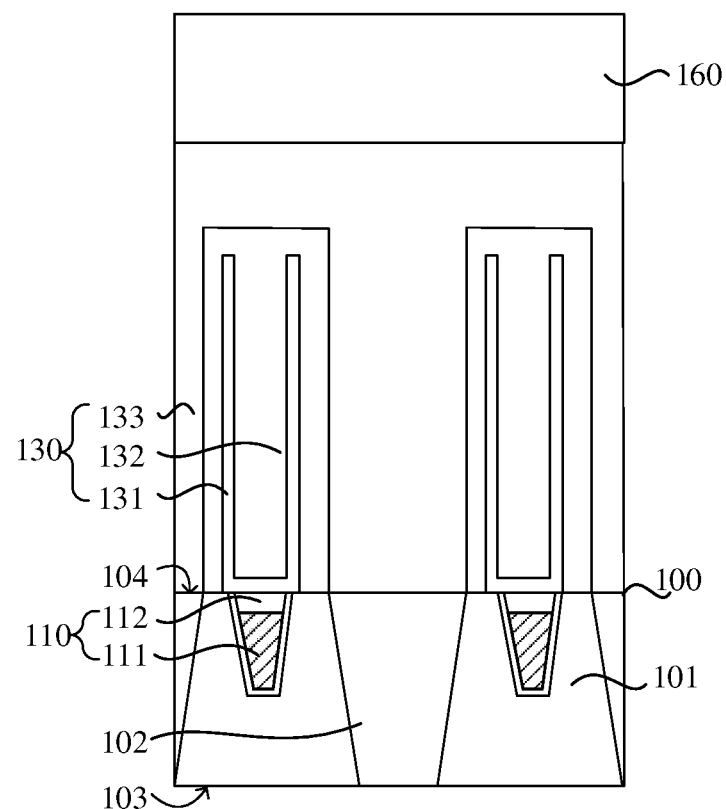

Referring to FIG. 16, the insulation layer 13 and the base 14 are removed until the surfaces of the active regions 101 are exposed, to form a basis for subsequent ion doping of the active regions 101.

Figure 17:
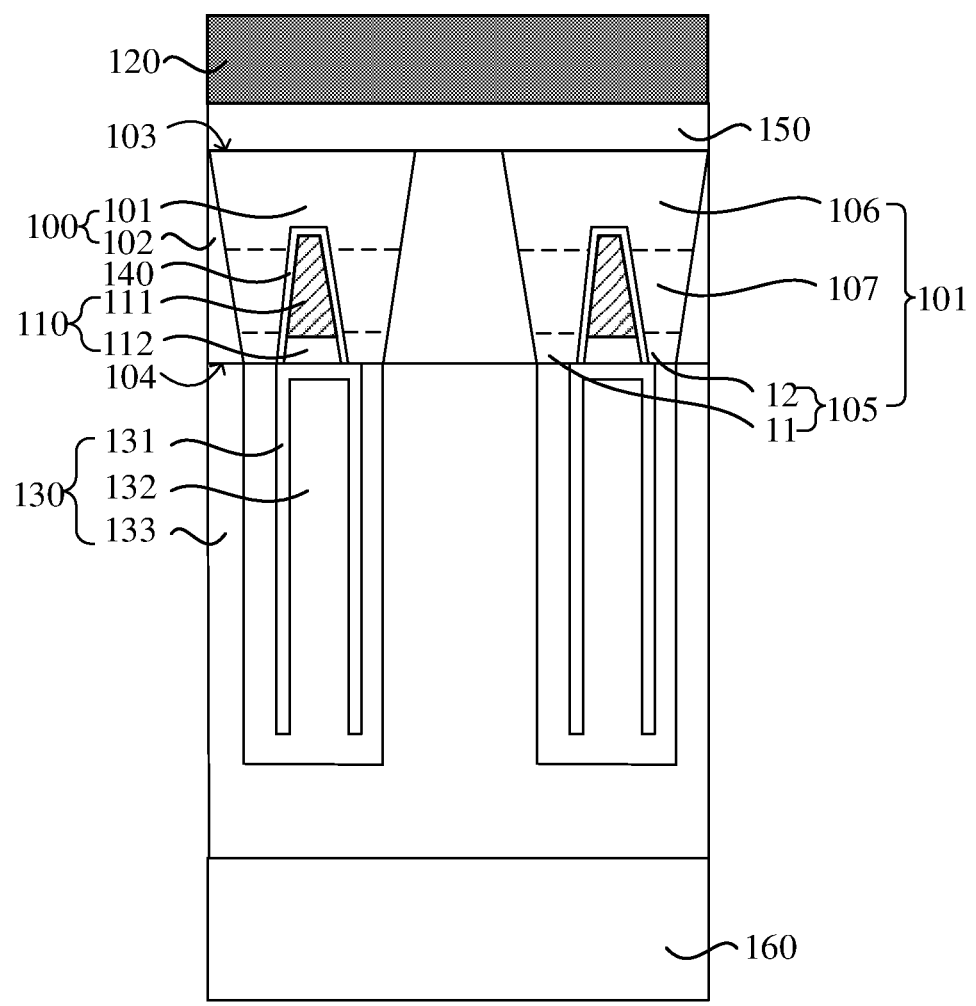

Referring to FIG. 17, the active region 101 is doped with ions, to form the first source-drain doped region 105, the channel region 107, and the second source-drain doped region 106 that are sequentially arranged from the second surface 104 towards the first surface 103 in the active region 101. In some embodiments, before the active region 101 is doped with ions, the method further includes: flipping the semiconductor structure, such that the first surface 103 is located above the second surface 104.

In some embodiments, the active region 101 is doped with ions along a direction pointing from the first surface 103 to the second surface 104.

Figure 18:
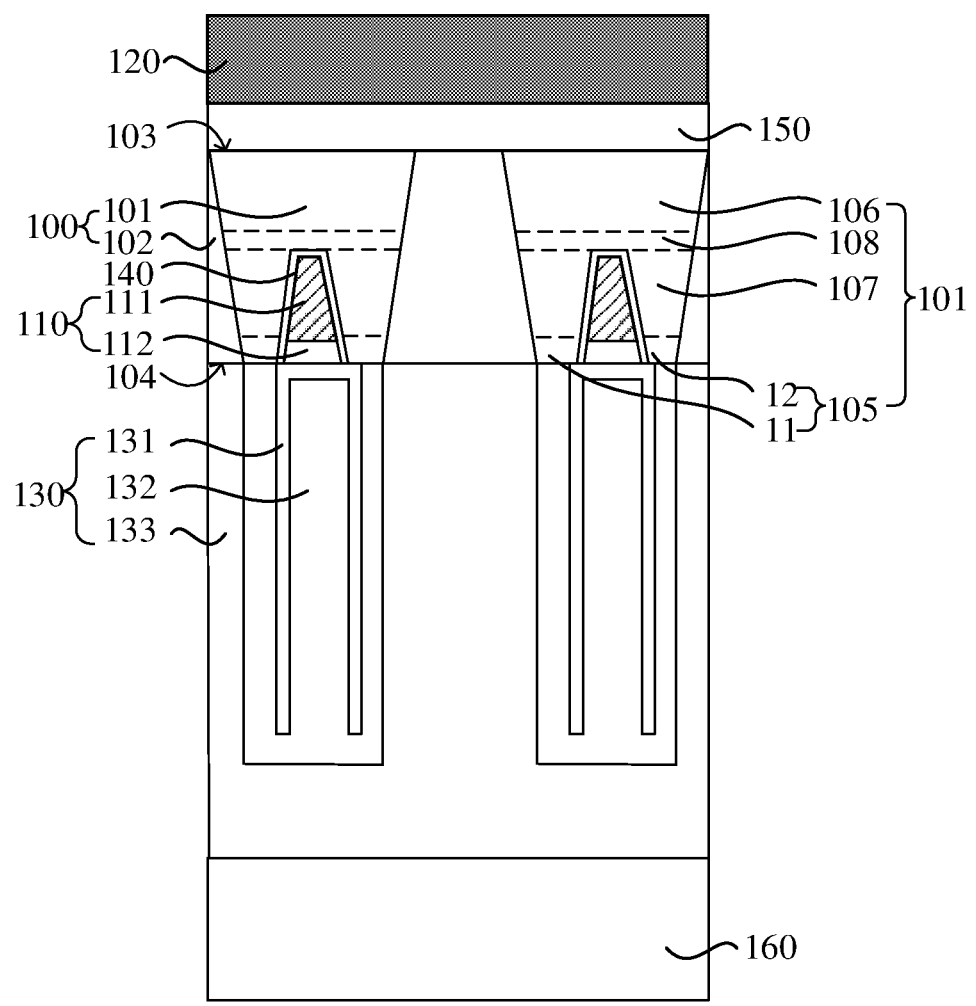

Referring to FIG. 18, in some embodiments, before the second source-drain doped region 106 is formed, the method further includes: forming a doped region 108, where the doped region 108 is located on a surface of the channel region 107, and dopant ions of the doped region 108 and the second source-drain doped region 106 are of a same ion type. It may be understood that, the current flows from the first source-drain doped region 105, enters the channel region 107 through the doped region 108, and finally arrives at is the second source-drain doped region 106. Through the buffer effect of the doped region 108, the threshold voltage of the gate can be adjusted.

In some embodiments, a method for forming the doped region 108 includes: forming an initial doped region (not shown in the figure), where the initial doped region is located on a top surface of the channel region 107 and the substrate 100 exposes a surface of the initial doped region; heavily doping the initial doped region from the first surface 103 towards the second surface 104, to increase an ion concentration in a part of the initial doped region, where the remaining initial doped region is used as the doped region 108, and the part of the initial doped region with the increased ion concentration is used as the second source-drain doped region 106. In other words, after the channel region 107 is formed, an undoped part of the active region 101 is lightly doped to serve as the initial doped region; then, the initial doped region is heavily doped to increase the ion concentration in a part of the initial doped region. The part of the initial doped region with the increased ion concentration is used as the second source-drain doped region 106, and the remaining initial doped region is used as the doped region 108.

In this embodiment of the present disclosure, the active regions 101 are doped with ions after the capacitor structures 130 are formed, to as to form the source, gate, and drain of the transistor, and form a PN junction in the active region 101, thereby meeting the performance of the transistor. The bit line structure 120 is formed on the first surface 103 of the substrate 100, the buried word line structure 110 located on the second surface 104 of the substrate 100 and in the active regions 101 is formed, and the capacitor structures are further formed on the second surface 104, to form a semiconductor structure. A current flow direction in the semiconductor structure is controlled to be parallel to the direction from the second surface 104 towards first surface 103, thereby shortening a flow path of carriers, improving a response speed of the semiconductor structure, and improving the electrical performance of the semiconductor structure.

Those skilled in the art can understand that the above implementations are specific embodiments for implementing the present disclosure. In practical applications, various changes may be made to the above embodiments in terms of form and details without departing from the spirit and scope of the embodiments of the present disclosure. Any is person skilled in the art may make changes and modifications to the embodiments without departing from the spirit and scope of the present disclosure. Therefore, the protection scope of the present disclosure should be subject to the scope defined by the claims.

The invention claimed is:

1. A semiconductor structure, comprising:
   a substrate, comprising active regions arranged in an array and an isolation structure separating the active regions, wherein the substrate has a first surface and a second surface opposite to each other, wherein each of the active regions comprises a first source-drain doped region extending from the second surface to an interior of the substrate and a second source-drain doped region extending from the first surface to the interior of the substrate;
   a buried word line structure, located in the substrate and extending along a first direction, wherein the buried word line structure extends from the second surface to the first surface, and the first source-drain doped region is located in a same active region and at two opposite sides of the buried word line structure;
   a bit line structure, located on the first surface of the substrate and electrically connected to the second source-drain doped regions of the active regions, wherein the bit line structure extends along a second direction; and
   capacitor structures, located on the second surface of the substrate and correspondingly connected to the first source-drain doped regions of the active regions in a one- to-one manner.

2. The semiconductor structure according to claim 1, wherein
   dopant ions of the first source-drain doped region and the second source-drain doped region are of a same ion type.

3. The semiconductor structure according to claim 1, wherein
   the first source-drain doped region comprises: a first doped sub-region and a second doped sub-region, the first doped sub-region and the second doped sub-region are arranged at an interval in a same active region and at two opposite sides of the buried word line structure.

4. The semiconductor structure according to claim 3, wherein
   a difference between a width of the first doped sub-region and a width of the second doped sub-region is less than ⅓ of the width of the second doped sub-region.

5. The semiconductor structure according to claim 3, wherein
   a doping concentration of the second doped sub-region is higher than a doping concentration of the first doped sub-region.

6. The semiconductor structure according to claim 1, wherein
   in a direction from the second surface towards the first surface, a thickness of the buried word line structure is ⅓ to ⅔ of a thickness of the substrate.

7. The semiconductor structure according to claim 1, wherein
   the active region further comprises a channel region; the channel region is located between the first source-drain doped region and the second source-drain doped region, and is connected to the first source-drain doped region; the buried word line structure comprises a word line conductive layer and a word line protective layer, the first source-drain doped region is located in the same active region and at two opposite sides of the buried word line structure, and at least a part of the word line conductive layer is located in the channel region.

8. The semiconductor structure according to claim 7, wherein
   the channel region is unparallel with the first surface or the second surface.

9. The semiconductor structure according to claim 7, wherein
   in a direction from the second surface towards the first surface, a thickness of the word line conductive layer is greater than or equal to a thickness of the channel region.

10. A method of manufacturing a semiconductor structure, comprising:
    providing a substrate, wherein the substrate comprises active regions arranged in an array and an isolation structure separating the active regions, and the substrate has a first surface and a second surface opposite to each other, wherein each of the active regions comprises a first source-drain doped region extending from the second surface to an interior of the substrate and a second source-drain doped region extending from the first surface to the interior of the substrate;
    forming a buried word line structure extending along a first direction in the substrate, wherein the buried word line structure extends from the second surface to the first surface, and the first source-drain doped region is located in a same active region and at two opposite sides of the buried word line structure;
    forming a bit line structure extending along a second direction on the first surface of the substrate, wherein the bit line structure electrically connected to the second source-drain doped regions of the active regions; and
    forming capacitor structures on the second surface of the substrate, wherein the capacitor structures correspondingly connected to the first source-drain doped regions of the active regions in a one-to-one manner.

11. The method of manufacturing a semiconductor structure according to claim 1, before the buried word line structure is formed, the method further comprises:
    doping the active region with ions, to form the first source-drain doped region, a channel region, and the second source-drain doped region that are sequentially arranged from the second surface towards the first surface in the active region, wherein dopant ions of the first source-drain doped region and the second source-drain doped region are of a same ion type.

12. The method of manufacturing a semiconductor structure according to claim 1, after the capacitor structures are formed, the method further comprises:
doping the active region with ions, to form the first source-drain doped region, a channel region, and the second source-drain doped region that are sequentially arranged from the second surface towards the first surface in the active region, wherein dopant ions of the first source-drain doped region and the second source-drain doped region are of a same ion type.

13. The method of manufacturing a semiconductor structure according to claim 11,
before the second source-drain doped region is formed, the method further comprises: forming a doped region, wherein the doped region is located on a surface of the channel region, and dopant ions of the doped region and the second source-drain doped region are of a same ion type.

14. The method of manufacturing a semiconductor structure according to claim 13, wherein a method for forming the doped region comprises:
forming an initial doped region, wherein the initial doped region is located on a top surface of the channel region, and the substrate exposes a surface of the initial doped region; and
heavily doping the initial doped region from the first surface towards the second surface, to increase an ion concentration in a part of the initial doped region, wherein a remaining initial doped region is used as the doped region, and a part of the initial doped region with the increased ion concentration is used as the second source-drain doped region.

15. The method of manufacturing a semiconductor structure according to claim 10, wherein
the substrate is silicon-on-insulator, and the substrate comprises: the active regions, an insulation layer located on bottom surfaces of the active regions, and a base located on a bottom surface of the insulation layer; and a method for forming the bit line structure comprises: patterning the base and the active regions, such that the first surface exposes the bottom surfaces of the active regions; and
forming the bit line structure, wherein the bit line structure is in contact with the bottom surfaces of the active regions.

16. The semiconductor structure according to claim 1, further comprising:
a barrier layer arranged between the bit line structure and the substrate.

17. The semiconductor structure according to claim 7, wherein each of the active regions further comprises a doped region arranged between the channel region and the second source-drain doped region, wherein dopant ions of the doped region is the same as dopant ions of the second source-drain doped region and a concentration of the dopant ions of the doped region is lower than that of the dopant ions of the second source-drain doped region.

18. The semiconductor structure according to claim 4, wherein
a doping concentration of the second doped sub-region is higher than a doping concentration of the first doped sub-region.

* * * * *